(12) United States Patent
Maitre et al.

(10) Patent No.: US 11,879,908 B2
(45) Date of Patent: Jan. 23, 2024

(54) METHOD FOR DETERMINING AN OPERATIONAL STATUS OF AN ELECTRICAL LOAD OF A HEAVY-DUTY VEHICLE

(71) Applicant: VOLVO TRUCK CORPORATION, Gothenburg (SE)

(72) Inventors: Julien Maitre, Chuzelles (FR); Maxime Valero, Meyzieu (FR); Benjamin Foras, Lyons (FR)

(73) Assignee: VOLVO TRUCK CORPORATION, Gothenburg (SE)

( * ) Notice: Subject to any disclaimer, the term of this patent is extended or adjusted under 35 U.S.C. 154(b) by 148 days.

(21) Appl. No.: 17/652,203

(22) Filed: Feb. 23, 2022

(65) Prior Publication Data
US 2022/0291273 A1 Sep. 15, 2022

(30) Foreign Application Priority Data

Mar. 11, 2021 (EP) ..................................... 21162116

(51) Int. Cl.
| | |
|---|---|
| *H01H 47/00* | (2006.01) |
| *G01R 31/00* | (2006.01) |
| *B60L 58/12* | (2019.01) |
| *G01R 21/133* | (2006.01) |
| *H02H 1/00* | (2006.01) |
| *H02H 3/08* | (2006.01) |

(52) U.S. Cl.
CPC ............ *G01R 31/007* (2013.01); *B60L 58/12* (2019.02); *G01R 21/133* (2013.01); *H02H 1/0007* (2013.01); *H02H 3/08* (2013.01); *B60L 2200/40* (2013.01)

(58) Field of Classification Search
CPC .. G01R 31/007; G01R 21/133; H02H 1/0007; H02H 3/08; B60L 58/12; B60L 2260/44; B60L 2200/40
USPC ......................................................... 361/191
See application file for complete search history.

(56) References Cited

U.S. PATENT DOCUMENTS

| | | | |
|---|---|---|---|
| 2010/0286856 | A1 | 11/2010 | Le Brusq et al. |
| 2020/0055473 | A1 | 2/2020 | Ferrel et al. |
| 2020/0317057 | A1 | 10/2020 | Salter et al. |

OTHER PUBLICATIONS

European Search Report dated Jul. 28, 2021 in corresponding European Patent Application No. EP21162116.4, 9 pages.

*Primary Examiner* — Jared Fureman
*Assistant Examiner* — Lucy M Thomas
(74) *Attorney, Agent, or Firm* — Venable LLP; Jeffri A. Kaminski (57) ABSTRACT

A control method for determining an operational status of an electrical load of a heavy-duty vehicle includes measuring a global current consumption of the electrical network when the electrical load is not activated, detecting an activation of the electrical load, measuring the global current consumption of the electrical network after the electrical load has been activated, determining an electrical current consumption of the electrical load, determining a reference current consumption of the electrical load, if the difference between the determined electrical current consumption of the electrical load and the determined reference current consumption is higher than a first predetermined threshold and lower than a second predetermined threshold, the second predetermined threshold being higher than the first predetermined threshold, set the operational status of the electrical load to a first status called "nominal operation".

15 Claims, 7 Drawing Sheets

METHOD FOR DETERMINING AN OPERATIONAL STATUS OF AN ELECTRICAL LOAD OF A HEAVY-DUTY VEHICLE

TECHNICAL FIELD

This disclosure relates to a method for determining an operational status of an electrical load of a vehicle, in particular heavy-duty vehicles like trucks, buses and construction equipment.

BACKGROUND ART

The electrical network of a vehicle, for example a heavy-duty vehicle, is designed to handle the power consumption of the original equipment fitted by the vehicle manufacturer. This means that the electrical generator, the electrical energy storage battery, the harness and the various relays are designed to handle the current consumption of the different electrical loads that can equip the truck in its commercial definition. Said electrical loads are known as "internal loads". For heavy duty vehicles, it is common that the vehicle owner installs additional equipment, also known as "external loads", to adapt his vehicle to his particular use or preferences. Usually, trucks are provided with connection means that enable the customer to add auxiliary electric equipment, e.g. additional lamps. These connection means are known as 'preparation kits'. For example, a fridge can be installed in the cabin. Similarly, additional high beam projectors can be added to improve the vehicle lighting. These extra electrical equipment, which are also known as "external loads" or 'Bodybuilder equipment' can significantly increase the electric power to be provided by the electrical network and can make this network operate in conditions for which it was not originally designed for.

Consequently, the reliability of the electrical network may be altered and jeopardized. Premature fuse ageing can occur. In the worst cases, overheating of harness wires may occur as well. It can particularly be the case when the vehicle owner has modified the fuse rating compared to the original specification. Eventually, a high current consumption of BodyBuilder loads may lead to the collapse of the on-board network.

There is therefore a need for estimating the electric current consumption of the various equipment and electrical loads in order to detect anomalous situations that may jeopardize or compromise the safe operation of the vehicle. Corrective actions may also be implemented when potentially unsafe conditions are detected.

SUMMARY

It is proposed a method for determining an operational status of an electrical load configured to be electrically supplied by an electrical network of a heavy-duty vehicle, the electrical network comprising at least one electrical energy storage system and one electrical generator, the method comprising preliminary steps consisting in:
(a) measuring a global current consumption of the electrical network,
(b) detecting an activation or a deactivation of the electrical load,
(c) measuring the global current consumption of the electrical network after the electrical load has been activated or deactivated,
(d) determining the current consumption of said electrical load from the measured global current consumptions before and after said electrical load has been activated or deactivated;
wherein the above preliminary steps (a) to (d) are reiterated at least twice in order to obtain at least two values representative of the current consumption of the electrical load, said at least two values being saved in a memory,
(e) calculating a reference current consumption of the electrical load as a function of the at least two values saved in memory and saving said reference current consumption value in memory,
(f) at each new activation or deactivation of the electrical load, determining the electrical current consumption of the electrical load by comparing the global current consumption of the electrical network before and after said electrical load has been activated or deactivated,
(g) calculating the difference between the current consumption of the electrical load and the reference current consumption,
(h) if the difference is higher than a first predetermined threshold and lower than a second predetermined threshold, the second predetermined threshold being higher than the first predetermined threshold, set the operational status of the electrical load to a first status called "nominal operation".

The electrical consumption of the electrical load that has been activated is determined from the global electrical network consumption just before and just after the activation of the load. This consumption is compared with a reference value. This reference value is specific to the load that has been activated, since it is associated with the load whose activation has been detected. If the determined electrical consumption is close enough to the reference value, the method considers that the electrical load is operating properly, which means without additional components and without electrical fault.

The following features can be optionally implemented, separately or in combination one with the others.

According to one embodiment, the method further comprises the step:
(i) if the difference is higher than the second predetermined threshold or lower than the first predetermined threshold, set the operational status of the electrical load to a second status called "anomalous operation".

According to an example of implementation of the method, the reference current consumption of the electrical load is the median or average of values stored in memory.

According to an embodiment of the method, the difference between the determined electrical current consumption of the electrical load and the determined reference current consumption can be the absolute difference between the two quantities. In other words, the determined difference is the subtraction of the determined reference current consumption from the determined electrical current consumption of the electrical load.

According to another embodiment of the method, the difference between the determined electrical current consumption of the electrical load and the determined reference current consumption can be the relative difference between the two quantities. In other words, the determined difference is the subtraction of the determined reference current consumption from the determined electrical current consumption of the electrical load, then divided by the determined reference current consumption.

According to an embodiment of the method, the determined electrical current consumption of the electrical load can be instantaneous value.

According to another embodiment of the method, the determined electrical current consumption of the electrical load can be an averaged value. It means that the data is the result of the average of several successive samples.

In an example of implementation, the heavy-duty vehicle is for example a truck.

The electrical network may comprise an electronic control unit configured to selectively activate or deactivate the electrical load.

According to one embodiment, the electronic control unit is configured to selectively activate or deactivate a relay configured to supply electrical power to the electrical load.

According to another embodiment, the electronic control unit is configured to selectively activate or deactivate an output configured to supply electrical power to the electrical load.

According to one aspect of the method, the electrical energy storage system comprises a battery.

According to an embodiment, the electrical energy storage system may comprise several batteries connected in series or in parallel.

According to an embodiment, the electrical generator comprises an alternator.

According to another embodiment, the electrical generator comprises a voltage converter.

According to one aspect of the method, in step (d), the electrical current consumption of the electrical load is determined by subtracting the background electrical current consumption of the electrical network when the electrical load is not activated from the electrical current consumption of the electrical network when the electrical load is activated.

According to another aspect of the method, the electrical network current consumption is determined from the electrical current supplied by the electrical generator and from the electrical current absorbed by the electrical energy storage system.

According to an example of implementation, the electrical network current global consumption is determined by subtracting the current absorbed by the electrical energy storage system from the current supplied by the electrical generator.

In an embodiment of the method, the current intensity through the electrical energy storage system is measured by a current sensor.

The current intensity through the electrical generator is measured by a current sensor.

According to an embodiment in which the electrical network comprises several electrical energy storage systems, the current intensity through the equivalent single electrical energy storage system is the algebraic sum of the individual current of each individual electrical energy storage system.

In this exemplary embodiment, the current intensity through the equivalent single electrical energy storage system may be determined by summing up each individual current, each individual current being determined by an individual current sensor.

In an alternative embodiment, the current intensity through the equivalent single electrical energy storage system can be determined by a single individual current sensor, this current sensor being located in a common branch so that the sum of individual currents flow through the single current sensor.

In yet another variant, a combination of the two above mentioned embodiments may be used in case a common branch cannot be defined. Several current sensors will be employed, with one sensor being located in a branch common to at least two electrical energy storage systems, and duplicated sensors for sections that have no common branch.

According to an implementation of the method, the current intensity through the electrical generator is determined from a rotation speed of the electrical generator and a duty-cycle of the electrical generator.

In embodiments in which the electrical network comprises several electrical generators, the current intensity through the equivalent single electrical generator is the algebraic sum of the individual current of each individual electrical generator.

According to an aspect of the method, the reference current consumption of the electrical load is stored in a permanent memory of an electronic control unit.

According to an aspect of the method, step (i) comprises the sub-step:
  if the difference (d) between the determined electrical current consumption of the electrical load and the determined reference current consumption is higher than the second predetermined threshold, set the operational status to "electrical overload".

According to another aspect of the method, step (i) comprises the sub-step:
  if the difference between the determined electrical current consumption of the electrical load and the determined reference current consumption is higher than a third predetermined threshold, the third predetermined threshold being higher than the second predetermined threshold, set the operational status to "severe overload".

According to yet another aspect of the method, step (i) comprises the sub-step:
  if the difference between the determined electrical current consumption of the electrical load and the determined reference current consumption is higher than the second predetermined threshold and lower than the third predetermined threshold, set the operational status to "mild overload".

According to a complementary aspect of the method, step (i) comprises the sub-step:
  if the difference between the determined electrical current consumption of the electrical load and the determined reference current consumption is lower than the first threshold, set the operational status to "inactive equipment".

The method may comprise the step:
  (j) if the operational status of the electrical load is set to "anomalous operation", send an alarm signal to an occupant of the vehicle.

The alarm signal may for example be a light on a dashboard of the vehicle.

In another embodiment, the alarm signal may be a sound emitted in a passenger bay/cabin of the vehicle.

Alternatively or in complement, the alarm signal can be a message sent to a mobile phone of a vehicle occupant.

According to an embodiment, the method comprises the step:
  (k) if the operational status of the electrical load is set to "severe overload", the activation of the electrical load is switched-off.

According to an aspect of the method, step (b) comprises the sub-step:
  receiving activation status information of the electrical load from an electronic control module configured to activate the electrical load.

In an example of implementation of the method, the activation status information is provided through a digital communication network.

According to an embodiment of the method, step (c) comprises the sub-step:

When the activation of the electrical load is detected, wait for a stability condition to be met before determining an electrical current consumption of the electrical network.

According to an embodiment, the stability condition is met after a predetermined time period has elapsed.

According to yet another embodiment, the stability condition is met when the electrical network current intensity variations versus time are lower than a fourth predetermined threshold.

According to an aspect of the proposed method, successive values of the determined electrical current consumption of the electrical load determined by iterations of step (a) to (d) are stored in a storage table.

The determined electrical current consumption of the electrical load may be stored in a permanent memory of an electronic control unit.

The permanent memory is for example an eeprom.

According to an embodiment, the determined electrical current consumption of the electrical load is stored in a circular buffer.

According to an aspect of the method, a new iteration of the determination of the electrical current consumption of the electrical load is performed at each new iteration of the activation or deactivation of the electrical load.

According to an aspect of the method, step (g) comprises the sub-step:

updating reference current consumption of the electrical load using the determined electrical current consumption of the electrical load.

According to an aspect of the method, step (g) comprises the sub-steps:

Sort successive values of determined electrical current consumption of the electrical load stored in the storage table by ascending order, Exclude lowest value and highest value of the storage table, calculate value of reference current consumption of the electrical load from remaining values of the storage table.

According to an implementation of the method, the updated value of the reference current consumption of the electrical load is the average value of remaining values of the storage table.

The invention also relates to an electronic control unit configured to implement a method as described above.

The invention relates as well to a heavy-duty vehicle comprising an electronic control unit as above mentioned.

BRIEF DESCRIPTION OF DRAWINGS

Other features, details and advantages will be shown in the following detailed description and on the figures, on which.

DESCRIPTION OF EMBODIMENTS

Figure 7:
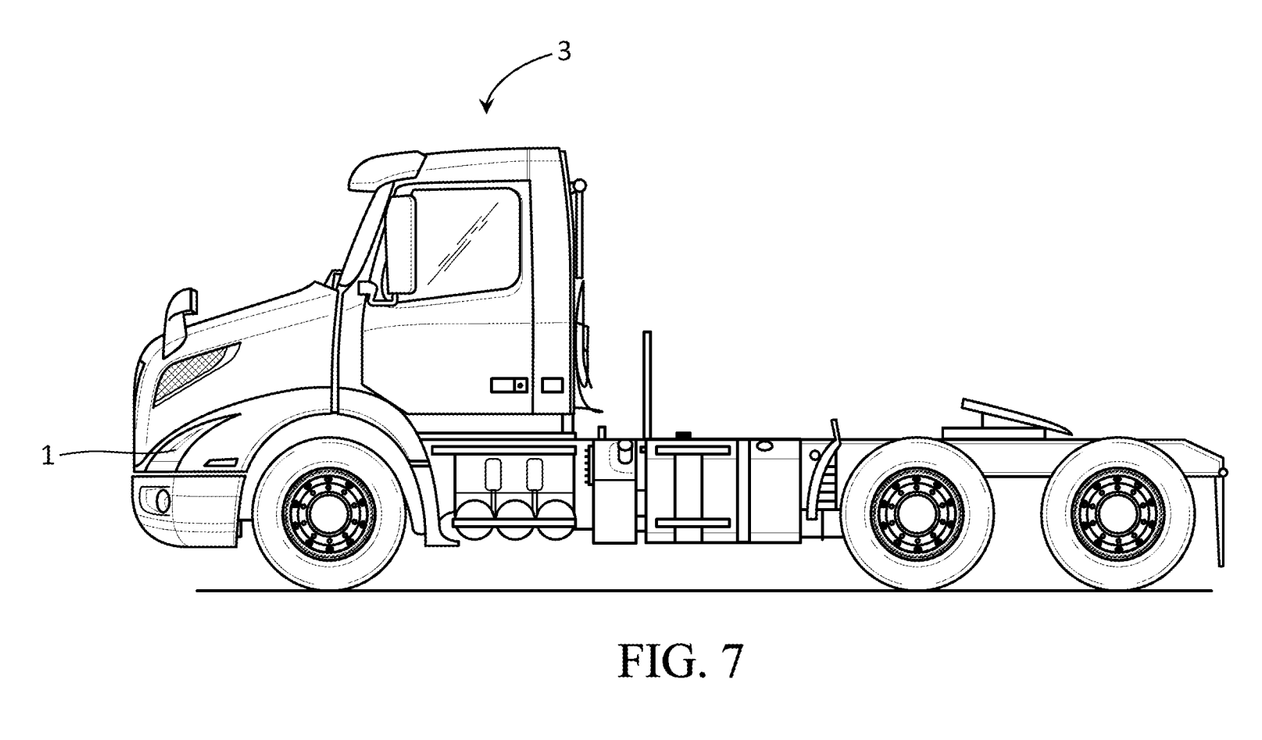
FIG. 7 is a general view of a heavy-duty vehicle in which a method according to an embodiment on the invention can be implemented.

FIG. 7 illustrates in a non-limiting manner a heavy-duty vehicle 3. The vehicle considered here is a truck. The proposed concept is also valid for any kind of heavy-duty vehicles, including buses and construction vehicles.

The truck 3 is equipped with various electrical devices as standard equipment, like for example headlights, satnav system, or radio. These electrical devices can also be known as "internal loads" or "original or basic equipment".

Figure 1:
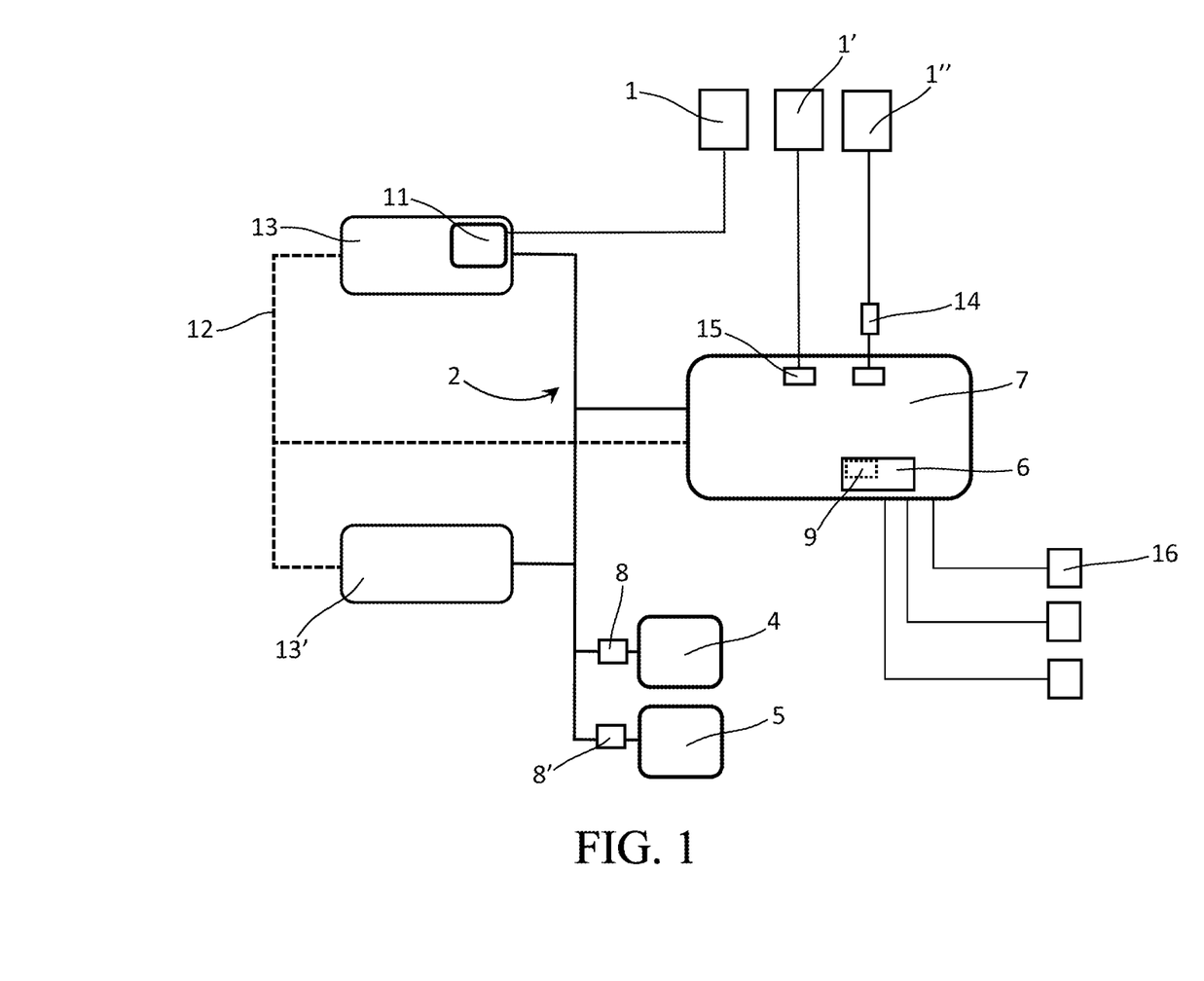
FIG. 1 is a schematic view of an electrical network of a heavy-duty vehicle.

The truck 3 comprises at least one electrical network 2 connecting together all the electrical devices. FIG. 1 is a schematic representation of an electrical network 2 of the truck 3. The electrical network can also be known as the "on-board network" or the "living network". It is usually a low voltage network, such as a 24V network or a 12V network.

The electrical network 2 comprise at least one Electrical Energy Storage System (acronym "EES") 4 and one electrical generator 5.

The electrical energy storage system 4 comprises a battery, typically a 24V battery, e.g. a Lead-Acid battery. According to an embodiment, the electrical energy storage system 4 may comprise several batteries connected in series or in parallel.

According to an embodiment, the electrical generator 5 comprises an alternator. This is the case for trucks powered by internal combustion engine. According to another embodiment, the electrical generator 5 comprises a voltage converter, e.g. a DC-to-DC voltage converter. This is the case for electrically powered trucks or electrically assisted trucks (Battery Electric Vehicle, Fuel Cell Electric Vehicle and Hybrid Electric Vehicle). In this case, the DC/DC converter makes the interface between the on-board network and the traction network, which is a higher voltage network (e.g. superior or equal to 48V) configured to supply one or more electric motors with higher voltage.

The heavy-duty vehicle 3 comprises an Electronic Control Unit (acronym "ECU") 7. It may comprise additional electronic control units 13, 13', each electronic control unit being dedicated to a function or to a group of functions, like for example engine control or passenger bay thermal management. The electronic control unit 7 can activate or deactivate the various electrical devices, according to the inputs of the driver or according to the inputs of other electronic systems of the truck. Electronic control unit 7 has different inputs connected to sensors 16.

The electrical network 2 may comprise an electronic control unit 7 configured to selectively activate or deactivate electrical loads. On FIG. 1, three different electrical loads 1, 1', 1" are represented. Any number of electrical loads can be present. This activation and deactivation can be achieved by different ways.

The electronic control unit 7 may be configured to selectively activate or deactivate a relay 14 (or other switching device) configured to supply electrical power to the electrical load 1". The electronic control unit 7 may also be configured to selectively activate or deactivate an output (or output connector) 15 configured to supply electrical power to the electrical load 1'.

In other words, an output line of the electronic control unit 7 can activate the electrical load 1 through a relay 14. An output line 15 of the electronic control unit 7 can directly activate the electrical load 1. Any number of outputs can be present.

In practice, there are many outputs 15 to enable the truck owner to fit many external devices. Outputs 15 can also be known as "preparation kits". It consists in a kit prepared for the connection of a "BodyBuilder" equipment.

Each electrical load 1 may be a group of electrical devices connected together in parallel. The group may comprise an equipment fitted as standard equipment (also known as "internal load") and another equipment added by the truck owner a posteriori (also known as "external load", "Body-Builder", "auxiliary equipment" or "special equipment"). The standard equipment and the additional equipment, or extra equipment, can be activated by a same output or can be individually activated. For example, the electrical load fitted as standard equipment can be the front high beam headlights of the truck, and the additional equipment can be an extra group of headlights. The extra headlights are activated simultaneously with the standard high beam headlights by the driver. Alternatively, said extra group of headlights (as a "BodyBuilder" equipment) can be activated separately.

It is usual that the truck owner installs additional equipment to enhance his vehicle and adapt it to his particular use or preferences. These additional equipment are known as "BodyBuilder". For example, a fridge can be installed in the cabin, or additional high beam projectors can be added to improve the vehicle lighting. These extra electrical equipment may be fitted without any control from the original vehicle manufacturer and can significantly increase the electric power to be supplied by the electrical network of the vehicle. Indeed, auxiliary equipment are connected to the on-board electrical network of the vehicle and therefore draw energy from the ESS and/or the electric generator if it is running. Therefore, the electrical network may operate in conditions for which it was not originally designed for. Consequently, the reliability of the electrical network may be compromised. For example, premature fuse ageing can occur. Battery capacity may be undersized, which may accelerate its ageing and lower its lifetime. In the worst cases, overheating of harness wires may occur as well. It can particularly be the case when the vehicle owner has modified the fuse rating compared to the original specification.

There is therefore a need for estimating the electric current consumption of the various equipment and electrical loads in order to detect anomalous situations that may compromise the safe operation of the vehicle. Corrective actions may also be implemented when potentially unsafe conditions are detected.

The electronic control unit 7 is configured to implement a method that will be described here below.

It is proposed a method for determining an operational status of an electrical load 1 configured to be electrically supplied by an electrical network 2 of a heavy-duty vehicle 3, the electrical network 2 comprising at least one electrical energy storage system 4 and one electrical generator 5, the method comprising preliminary steps consisting in:
(a) measuring a global current consumption I1 of the electrical network 2,
(b) detecting an activation or a deactivation of the electrical load 1,
(c) measuring the global current consumption I2 of the electrical network 2 after the electrical load 1 has been activated or deactivated,
(d) determining the current consumption I_L of said electrical load 1 from the measured global current consumptions I1, I2 before and after said electrical load 1 has been activated or deactivated,
wherein the above preliminary steps (a) to (d) are reiterated at least twice in order to obtain at least two values representative of the current consumption of the electrical load 1, said at least two values being saved in a memory,
(e) calculating a reference current consumption I_Ref of the electrical load 1 as a function of the at least two values saved in memory and saving said reference current consumption I_Ref value in memory.

Preliminary steps to which it is referred to above can be considered as steps for learning the "normal" current consumption of a load. Obviously, this learning phase has to be achieved under normal circumstances, i.e. with a fully operational electrical load. For instance, learning phase can be completed right after the installation of an external load, or at truck delivery time.

Afterwards, at each new activation or deactivation of the electrical load, there is a step (f) of determining the electrical current consumption of the electrical load by comparing the global current consumption of the electrical network 2 before and after said electrical load 1 has been activated or deactivated.

Further steps consist in:
(g) calculating the difference d between the current consumption I_L of the electrical load and the reference current consumption I_Ref,
(h) if the difference d is higher than a first predetermined threshold Th1 and lower than a second predetermined threshold Th2, the second predetermined threshold Th2 being higher than the first predetermined threshold Th1, set the operational status of the electrical load 1 to a first status called "nominal operation".

Figure 2:
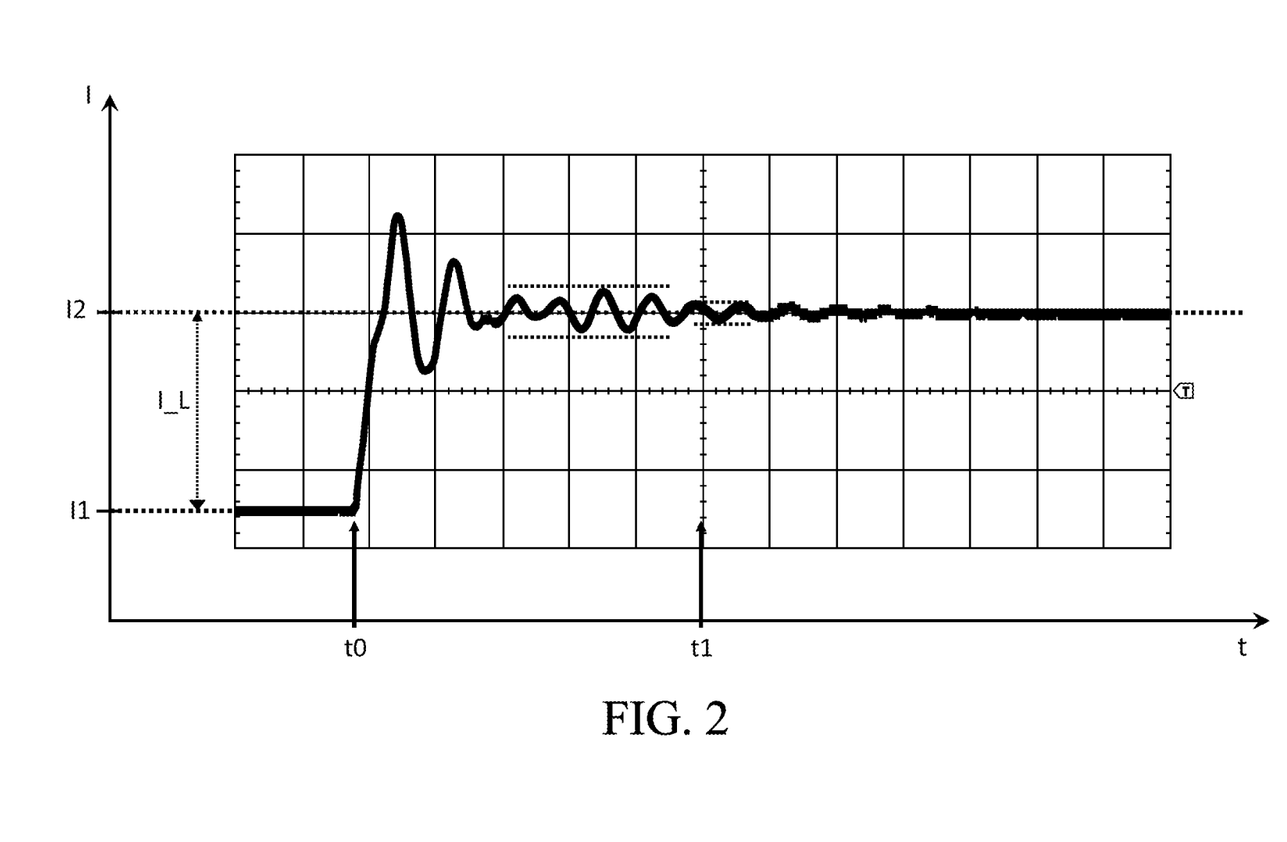
FIG. 2 is a temporal curve of the evolution of some operating parameters of an embodiment of a method according to the invention.

FIG. 2 represents the current consumption, or current intensity, in the electrical network 2. The electrical consumption I_L of the electrical load 1 that has been activated is determined from the global electrical network consumption just before and just after the activation of the load 1. Before activation, current intensity is I1. Electrical load 1 is activated at instant t0. Current intensity increases and stabilizes to a new value I2. From instant t1 current is steady. The shift from I1 to I2 can be linked to the specific contribution of the electrical load that has been activated. In step (d), the electrical current consumption I_L of the electrical load 1 is determined by subtracting the background electrical current consumption I1 of the electrical network 2 when the electrical load 1 is not activated from the electrical current consumption I2 of the electrical network 2 when the electrical load 1 is activated. Obviously, the same procedure can be completed during the deactivation of the load.

Obviously, if the electrical load 1 to which it is referred to above consists of a group of many electrical loads that are connected in parallel and that are activated/deactivated simultaneously, it will not be possible to determine the electrical current consumption of each electrical load of the group, but only the electrical current consumption of all electrical loads as a whole.

This current consumption I_L is then compared with a reference value I_Ref to determine the operational status of the electrical load 1. This reference value I_Ref is specific to the load 1 that has been activated, since it is associated with the load whose activation has been detected. If the determined electrical current consumption I_L is close enough to the reference value I_Ref, the method considers that the electrical load 1 is operating properly, which means without additional components fitted and without electrical fault. This operation state is therefore the nominal operation. The electrical load 1 is operating as intended by the vehicle manufacturer.

The method further comprises the step:
(i) if the difference d is higher than the second predetermined threshold Th2 or lower than the first predetermined threshold Th1, set the operational status of the electrical load 1 to a second status called "anomalous operation".

According to an example of implementation of the method, the reference current consumption I_Ref of the electrical load 1 is the median or average of values stored in memory.

All the electrical current consumptions are algebraic values, which means it can be positive or negative. When an electrical current consumption of an apparatus is positive, it means are electrical energy is absorbed by the apparatus. When an electrical current consumption of an apparatus is negative, it means are electrical energy is produced by the apparatus. Current consumption is synonymous with current intensity. Current intensity is measured in Ampere (A).

Figure 3:
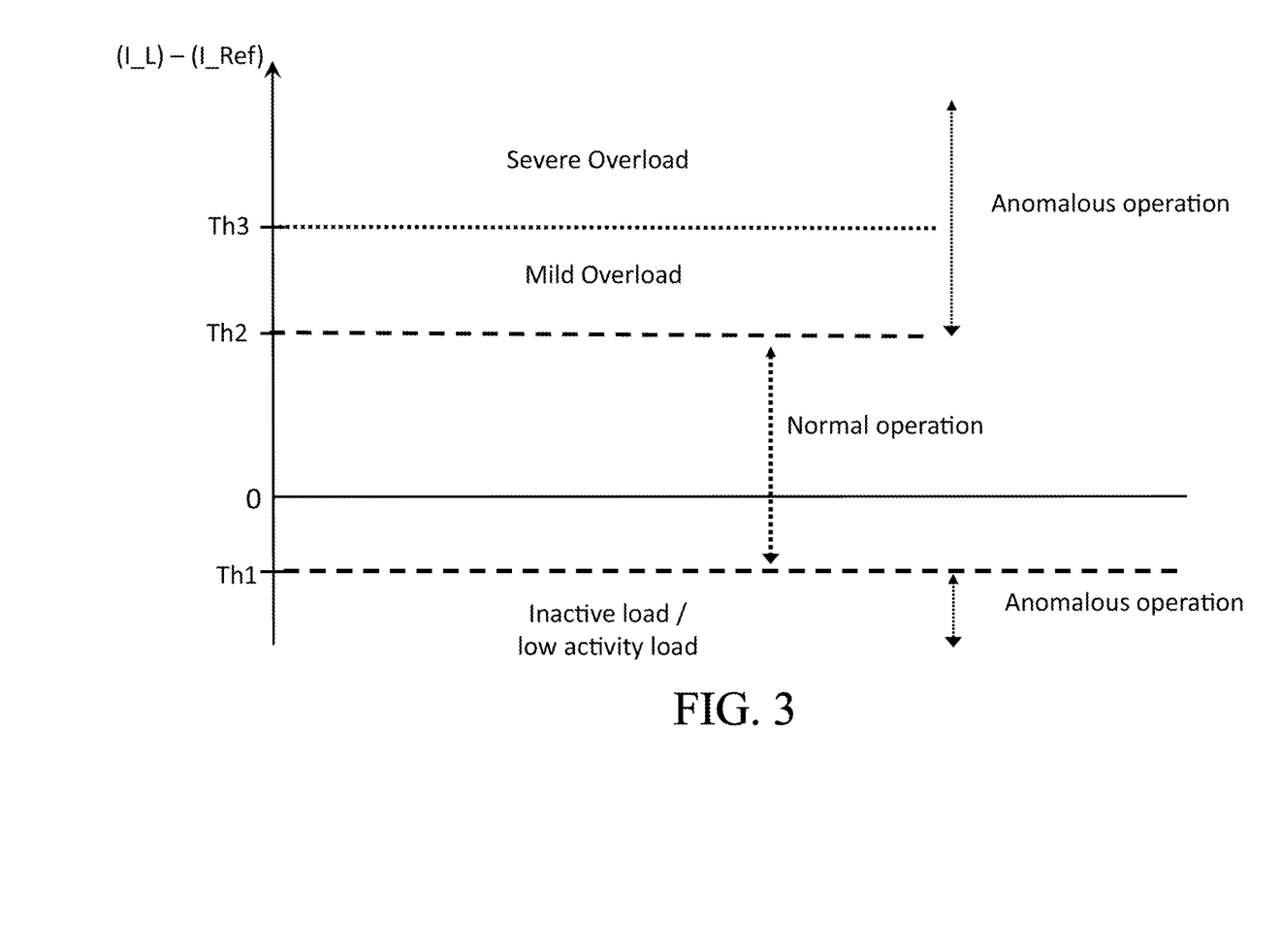
FIG. 3 is a diagram summarizing the various electrical statuses provided by an embodiment of the method.
Figure 4:
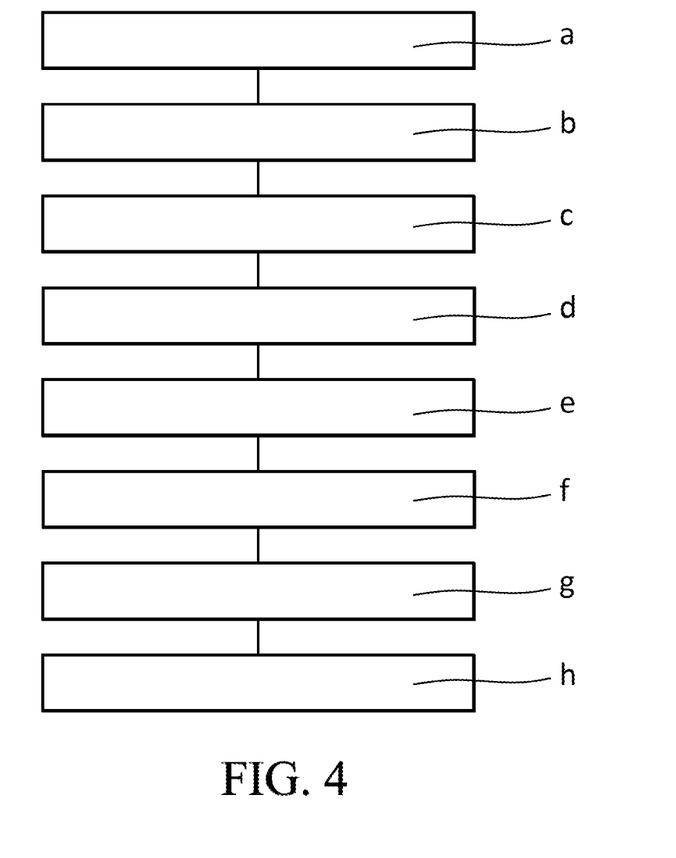
FIG. 4 is a block diagram of the different steps of an embodiment of the method.

The first predetermined threshold Th1 is a negative value. The second predetermined threshold Th2 is a positive value. The absolute value of the second predetermined threshold Th2 is higher than the absolute value of first predetermined threshold Th1. In other words, operational status is set to nominal operation when the difference d between the determined electrical current consumption I_L of the electrical load 1 and the determined reference current consumption I_Ref is relatively small. Conversely, operational status is set to anomalous operation when the difference is too large. Anomalous operation may come from a current consumption much lower than expected, which tends to indicate a malfunction or open circuit. Anomalous operation may come from a current consumption much higher than expected, which tends to indicate additional equipment fitted on top of the original electrical load. FIG. 3 summarizes the different statuses declared in function of the difference between determined electrical current consumption I_L and reference current consumption I_Ref.

According to an embodiment of the method, the difference d between the determined electrical current consumption I_L of the electrical load 1 and the determined reference current consumption I_Ref is the absolute difference between the two quantities/values. In other words, the determined difference is the raw subtraction of the determined reference current consumption I_Ref from the determined electrical current consumption I_L of the electrical load 1. In other words, it is calculated from the formula:

$$d=(I\_L)-(I\_Ref)$$

According to another embodiment of the method, the difference d between the determined electrical current consumption I_L of the electrical load 1 and the determined reference current consumption I_Ref is the relative difference between the two quantities/values. In other words, the determined difference is the subtraction of the determined reference current consumption I_Ref from the determined electrical current consumption I_L of the electrical load 1, then divided by the determined reference current consumption I_Ref. In other words, the following formula applies:

$$d = \frac{(I\_L) - (I\_Ref)}{I\_Ref}$$

According to an embodiment of the method, the determined electrical current consumption I_L of the electrical load 1 is an instantaneous value.

According to another embodiment of the method, the determined electrical current consumption I_L of the electrical load 1 can be an averaged value. It means that the data is in such a case the result of the average of several successive samples.

According to another aspect of the method, the electrical network 2 current consumption is determined from the electrical current supplied by the electrical generator 5 and from the electrical current absorbed by the electrical energy storage system 4.

More precisely, the electrical network 2 current global consumption is determined by subtracting the current absorbed by the electrical energy storage system 4 from the current supplied by the electrical generator 5.

The current intensity through the electrical energy storage system 4 is measured by a current sensor 8. The current intensity through the electrical generator 5 is measured by a current sensor 8'. Current intensity through the electrical energy storage system 4 can be positive or negative. When current intensity is positive, the energy storage system provides energy to the network. When current intensity is negative, the energy storage system is receiving energy from the network, which means it is charged by the network.

According to a non represented embodiment in which the electrical network comprises several electrical energy storage systems, the current intensity through the equivalent single electrical energy storage system is the algebraic sum of the individual current of each individual electrical energy storage system. The current intensity through the equivalent single electrical energy storage system may be determined by summing up each individual current, each individual current being determined by an individual current sensor.

Alternatively, the current intensity through the equivalent single electrical energy storage system can be determined by a single individual current sensor, this current sensor being located in a common branch so that the sum of individual currents flow through the single current sensor.

In another non represented variant, a combination of the two previous embodiments may be used in case a common branch cannot be defined. Several current sensors will be employed, with one sensor being located in a branch common to at least two electrical energy storage systems, and duplicated sensors for sections that have no common branch.

According to an implementation of the method, the current intensity through the electrical generator 5 is determined from a rotation speed of the electrical generator 5 and a duty-cycle of the electrical generator 5. In embodiments in which the electrical network comprises several electrical generators 5, the current intensity through the equivalent single electrical generator is the algebraic sum of the individual current of each individual electrical generator.

The electrical current consumption I_L of the electrical load 1 is determined only once for each activation of the electrical load 1. Two successive determinations of the electrical current consumption I_L of the electrical load 1 are always separated by a period during which the electrical load 1 is deactivated.

According to an aspect of the method, the reference current consumption I_Ref of the electrical load 1 is stored in a permanent memory of an electronic control unit 7.

According to an aspect of the method, step (i) comprises the sub-step:

if the difference d between the determined electrical current consumption I_L of the electrical load 1 and the determined reference current consumption I_Ref is higher than the second predetermined threshold Th2, set the operational status to "electrical overload".

According to another aspect of the method, step (i) comprises the sub-step:

if the difference d between the determined electrical current consumption I_L of the electrical load 1 and the determined reference current consumption I_Ref is higher than a third predetermined threshold Th3, the third predetermined threshold Th3 being higher than the second predetermined threshold Th2, set the operational status to "severe overload". This case may generate a thermal event in the vehicle and should be avoided.

According to yet another aspect of the method, step (i) comprises the sub-step:

if the difference d between the determined electrical current consumption I_L of the electrical load 1 and the determined reference current consumption I_Ref is higher than the second predetermined threshold Th2 and lower than the third predetermined threshold Th3, set the operational status to "mild overload". Although current intensity is in that case higher than expected, short term effects should not be present and only long term adverse effects should occur.

According to a complementary aspect of the method, step (i) comprises the sub-step:

if the difference d between the determined electrical current consumption I_L of the electrical load 1 and the determined reference current consumption I_Ref is lower than the first threshold Th1, set the operational status to "inactive equipment". In case current intensity is much lower than expected, it can be expected that at least some electrical circuits of the activated device are faulty and inoperative.

The detection of a malfunction may be indicated to the driver. For this, the method may comprise the step:

(j) if the operational status of the electrical load 1 is set to "anomalous operation", send an alarm signal to an occupant of the vehicle.

The alarm signal may for example be a light on a dashboard of the vehicle. In another embodiment, the alarm signal may be a sound emitted in a passenger bay of the vehicle. Alternatively or as a complement, the alarm signal can be a message sent to a mobile phone of a vehicle occupant.

Depending of the severity of the detected malfunction, corrective action may be implemented. For this, the method may comprise the step:

(k) if the operational status of the electrical load 1 is set to "severe overload", the activation of the electrical load 1 is switched-off. Potential hazards associated with the too-high current intensity are avoided or at least minimized.

If the operational status of the electric load 1 is set to "severe overload", it can be envisaged to compare the current consumption of said electric load 1 with the maximum capacity of the output fuse to which it is connected. If this maximum capacity is close to be exceeded, an alert can be sent to the driver, for example by displaying a message on the vehicle dashboard. The goal of such alert is to prevent the fuse from switching off. This also allows to avoid fuse ageing or damage over time.

The detection of the activation of the electrical load 1 is now more precisely described. Step (b) of the method comprises the sub-step:

receiving activation status information of the electrical load 1 from an electronic control module 11 configured to activate the electrical load 1.

As electrical architecture of the vehicle may include several electronic control units, the activation of the various electrical loads 1, 1', 1" may be performed by different electronic control units or electronic control module. The electronic control module 11 can be an electronic control unit different from the electronic control unit 7. The electronic control module 11 and the electronic control unit 7 can communicate with each other to exchange various data. For example; the activation status information is provided through a digital communication network 12. In another embodiment, the electronic control module 11 can be a part of the electronic control unit 7 itself.

The activation status provided by the electronic control module 11 takes a different value depending on whether the electrical load 1 is electrically supplied or not. The activation status of the electrical load 1 can for instance be a binary information. In other words, the activation status can be 'on' or 'off'. The activation status of the electrical load 1 can also be a discrete scale with more than two levels. For example, activation status can be like 1, 2, 3, with 1 corresponding to minimum rotation of an electrical load like a cooling fan, 2 corresponding to medium speed and 3 corresponding to maximum speed.

The activation of the electrical load 1 is detected when a transition between the inactive status and the active status is identified. For instance, activation of the load 1 can be achieved by the driver using a button or other control element.

After the activation of the electrical load 1 has been detected, current intensity may fluctuate due to transient electrical phenomena like relays rebound, inductive or capacitive effect of the loads connected to the electrical network 2 and the like. In order to avoid sampling current during these fluctuations, step (c) may comprise the sub-step:

When the activation of the electrical load 1 is detected, wait for a stability condition to be met before determining an electrical current consumption I2 of the electrical network 2.

The accuracy of the determination of the electrical current consumption I2 of the electrical network 2 may be improved when samples are taken while current oscillations are reduced to background noise.

According to an embodiment, the stability condition is met after a predetermined time period has elapsed. The predetermined time period is associated with the electrical load 1 considered. For this, each electrical load 1 is characterized and the duration after which steady state conditions are obtained are determined. The predetermined time period may be stored in a permanent memory of the electronic control unit 7.

According to yet another embodiment, the stability condition is met when the electrical network 2 current intensity variations versus time are lower than a fifth predetermined threshold.

Figure 5:
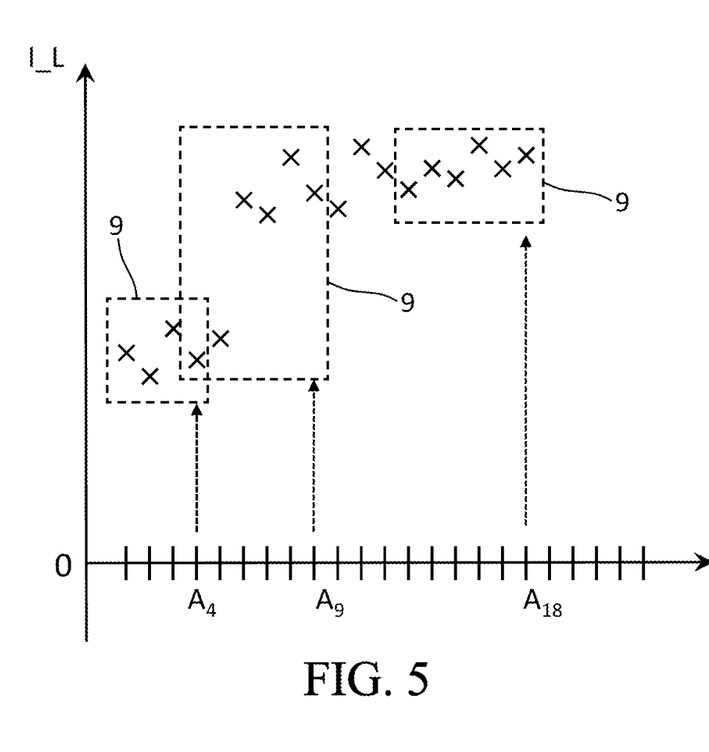
FIG. 5 is a schematic illustrating a step of the method.

According to an aspect of the proposed method, successive values V1, . . . , Vn of the determined electrical current consumption I_L of the electrical load 1 determined by iterations of step (a) to (d) are stored in a storage table 9.

Obviously, there is one storage table 9 for each output line, or preparation kit 15. In other words, one storage table is logically dedicated for one output 15.

The determined electrical current consumption I_L of the electrical load 1 may be stored in a permanent memory 6 of an electronic control unit 7. The permanent memory 6 is for example an EEPROM.

According to the described embodiment, the determined electrical current consumption I_L of the electrical load 1 is stored in a circular buffer 10. In other words, the latest determined value is stored in the storage table 9 as long as there is free space in the storage table 9. If the storage table 9 is full, meaning that the maximum storage capacity allowed has been used, the oldest value is overwritten by the latest value. The storage table 9 works as a first in, first out stack. The storage table 9 is a circular buffer 10. FIG. 5 illustrates the operation of the storage table 9. At instant $A_4$, 4 samples are available, therefore table 9 contains all 4 samples, each illustrated by a cross. At instant $A_9$, 9 samples are available. Table 9 contains the latest 6 samples. Table 9 at instant $A_9$ shares one common value with the content of instant $A_4$. The first three samples are not included in the table anymore. At instant $A_{18}$, 18 samples are available, and table 9 contains the latest 6 samples. Content of table 9 at instant $A_{18}$ share no common value with content of table 9 at instant $A_9$. Each time a new sampled value Vn of the determined electrical current consumption I_L of the electrical load 1 is determined, the new value Vn is stored.

Figure 6:
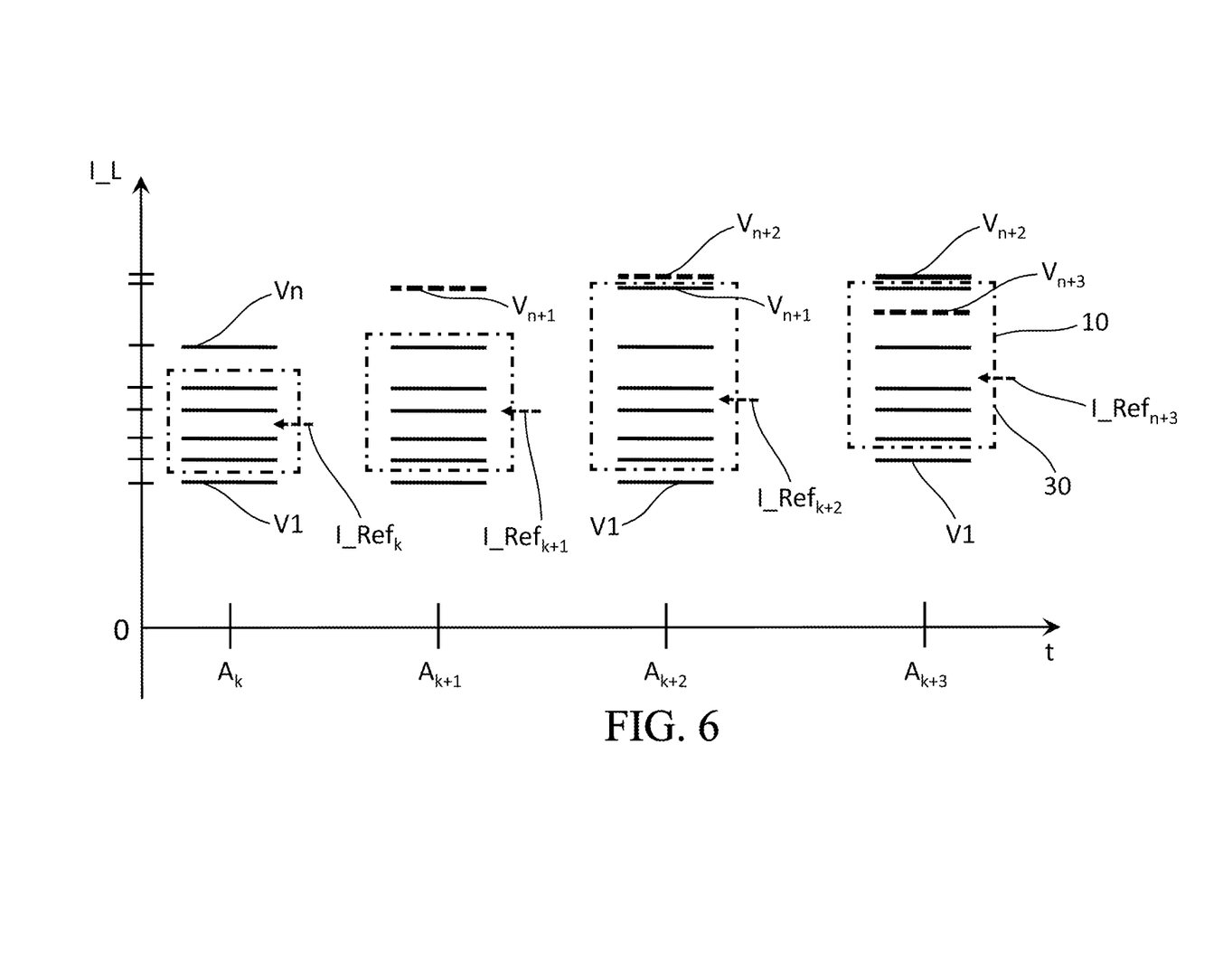
FIG. 6 is another schematic illustrating another step of the method.

According to an aspect of the method, a new iteration of the determination of the electrical current consumption I_L of the electrical load 1 is performed at each new iteration of the activation or deactivation of the electrical load 1. More precisely, at each iteration of the activation of the electrical load 1, the determined value of the electrical current consumption I_L of the electrical load 1 is stored in a circular buffer 10. The circular buffer 10 can store a determined number of successive values. FIG. 5 and FIG. 6 illustrate a circular buffer containing 6 values.

In order to adapt to a possible drift in the characteristics of the electrical load 1, reference current consumption may be updated. To this end, step (g) comprises the sub-step:

updating reference current consumption I_Ref of the electrical load 1 using the determined electrical current consumption I_L of the electrical load 1.

Step (g) may comprise the sub-steps:

Sort successive values V1, Vn of determined electrical current consumption I_L of the electrical load 1 stored in the storage table 9 by ascending order, Exclude lowest value and highest value of the storage table 9, calculate value of reference current consumption I_Ref of the electrical load 1 from remaining values of the storage table 9.

This sub-step is illustrated on FIG. 6. $A_k$, $A_{k+1}$, $A_{k+2}$ and $A_{k+3}$ illustrate the values V1, ..., Vn contained in storage table 9, at successive moments in time. The values inside the box in dotted line are the values remaining once the lowest value and highest value have been discarded. The arrows indicate the value of the average of the samples contained inside the box, therefore integrated in the calculation. Lowest value and highest value are not included in the calculation of the updated value of reference current consumption I_Ref, but remain stored in the storage table 9. Therefore, these values are still considered for the next iteration. On FIG. 6, at sample number k, 6 samples in total are available, therefore table 9 contains only 4 values. At sample number k+1, a new sample Vn+1 is calculated, and is the highest value from the table. Therefore, Vn+1 is excluded from table 9, which now contains 5 values so still has free space. At sample k+2, new sample Vn+2 is calculated, and set a new highest value in the table 9. Therefore, Vn+2 is excluded from the table 9 but Vn+1 now is integrated in the table. Table 9 now has 6 values so is full. At sample k+3, the oldest value, which is supposed to be V1, is overwritten and comes out of table 9. A new value of I_Ref, labeled I_Ref$_{k+3}$ is determined from the average value of the 6 values remaining once lowest and highest value have been discarded.

When an extra equipment is replaced, a reset has to be performed. This reset can be done in a workshop using an On-Board Diagnostics (acronym "OBD") device for example. Reset procedure consists in reiterating the preliminary steps to which it is referred to above. Reset procedure is not necessary if the equipment that is installed on the truck is exactly the same as the one which is replaced. Indeed, in such configuration, the electrical consumption would be the same.

The updated value of the reference current consumption I_Ref of the electrical load 1 is here the average value of remaining values of the storage table 9. Median value can also be used for the calculation. Other mathematical operations could also be implemented to determine the most representative value from the group of values stored in the storage table.

The invention claimed is:

1. A method for determining an operational status of an electrical load configured to be electrically supplied by an electrical network of a heavy-duty vehicle, the electrical network comprising at least one electrical energy storage system and one electrical generator, the method comprising preliminary steps consisting in:

(a) measuring a global current consumption of the electrical network, (b) detecting an activation or a deactivation of the electrical load, (c) measuring the global current consumption of the electrical network after the electrical load has been activated or deactivated, (d) determining the current consumption of said electrical load from the measured global current consumptions before and after said electrical load has been activated or deactivated, wherein the above preliminary steps (a) to (d) are reiterated at least two times in order to obtain at least two values representative of the current consumption of the electrical load, said at least two values being saved in a memory, (e) calculating a reference current consumption of the electrical load as a function of the at least two values saved in memory and saving said reference current consumption value in memory, (f) at each new activation or deactivation of the electrical load, determining the electrical current consumption of the electrical load by comparing the global current consumption of the electrical network before and after said electrical load has been activated or deactivated, (g) calculating the difference between the current consumption of the electrical load and the reference current consumption, (h) if the difference is higher than a first predetermined threshold and lower than a second predetermined threshold, the second predetermined threshold being higher than the first predetermined threshold, set the operational status of the electrical load to a first status called "nominal operation".

2. The method according to claim 1, in which the reference current consumption of the electrical load is the median or average of values stored in memory.

3. The method according to claim 1, further comprising the step:
(i) if the difference is higher than the second predetermined threshold or lower than the first predetermined threshold, set the operational status of the electrical load to a second status called "anomalous operation".

4. The method according to claim 3, in which step (i) comprises the sub-step:
if the difference between the determined electrical current consumption of the electrical load and the determined reference current consumption is higher than the second predetermined threshold, set the operational status to "electrical overload".

5. The method according to claim 3, in which step (i) comprises the sub-step:
if the difference between the determined electrical current consumption of the electrical load and the determined reference current consumption is higher than a third predetermined threshold, the third predetermined threshold being higher than the second predetermined threshold, set the operational status to "severe overload".

6. The method according to claim 5, comprising the step:
(k) if the operational status of the electrical load is set to "severe overload", the activation of the electrical load is switched-off.

7. The method according to claim 3, in which step (i) comprises the sub-step:
if the difference between the determined electrical current consumption of the electrical load and the determined reference current consumption is higher than the second predetermined threshold and lower than the third predetermined threshold, set the operational status to "mild overload".

8. The method according to claim 3, in which step (i) comprises the sub-step:
if the difference between the determined electrical current consumption of the electrical load and the determined reference current consumption is lower than the first threshold, set the operational status to "inactive equipment".

9. The method according to claim 3, comprising the step:
(j) if the operational status of the electrical load is set to "anomalous operation", send an alarm signal to an occupant of the vehicle.

10. The method according to claim 1, in which step (b) comprises the sub-step:
receiving activation status information of the electrical load from an electronic control module configured to activate the electrical load.

11. The method according to claim 1, in which step (h) comprises the sub-steps:
Sort successive values of determined electrical current consumption of the electrical load stored in the storage table by ascending order,
Exclude lowest value and highest value of the storage table,
calculate value of reference current consumption of the electrical load from remaining values of the storage table.

12. The method according to claim 1, in which the electrical network current global consumption is determined by subtracting the current absorbed by the electrical energy storage system from the current supplied by the electrical generator.

13. The method according to claim 1, in which a new iteration of the determination of the electrical current consumption of the electrical load is performed at each new iteration of the activation or deactivation of the electrical load.

14. An electronic control unit configured to implement a method according to claim 1.

15. A heavy-duty vehicle comprising an electronic control unit according to claim 1.

* * * * *